United States Patent
Sadakata

(10) Patent No.: US 7,460,426 B2
(45) Date of Patent: Dec. 2, 2008

(54) SEMICONDUCTOR MEMORY DEVICE

(75) Inventor: Hiroyuki Sadakata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 113 days.

(21) Appl. No.: 11/727,915

(22) Filed: Mar. 29, 2007

(65) Prior Publication Data
US 2007/0242545 A1 Oct. 18, 2007

(30) Foreign Application Priority Data
Mar. 31, 2006 (JP) ............................. 2006-099182

(51) Int. Cl.
G11C 7/00 (2006.01)
(52) U.S. Cl. ...................... 365/222; 365/201
(58) Field of Classification Search ................. 365/222, 365/201
See application file for complete search history.

(56) References Cited

U.S. PATENT DOCUMENTS

| 5,455,796 | A | 10/1995 | Inui et al. |
| 5,574,691 | A | 11/1996 | Tanida et al. |
| 5,995,429 | A | 11/1999 | Kojima et al. |
| 6,262,928 | B1 | 7/2001 | Kim et al. |
| 6,392,948 | B1 * | 5/2002 | Lee ............................. 365/222 |
| 6,404,688 | B2 * | 6/2002 | Okuyama et al. ........... 365/222 |
| 6,847,570 | B2 * | 1/2005 | Fujioka et al. .............. 365/222 |
| 7,187,608 | B2 * | 3/2007 | Ha et al. ..................... 365/222 |
| 2004/0062102 | A1 | 4/2004 | Beer et al. |

FOREIGN PATENT DOCUMENTS

JP  3238806  10/2001

* cited by examiner

Primary Examiner—Anh Phung
(74) Attorney, Agent, or Firm—McDermott Will & Emery LLP

(57) ABSTRACT

Through setting an internal test mode, a refresh operation for a DRAM is carried out by externally inputted address signals, instead of internally generated address signals, while maintaining the same number of memory cell arrays to be activated as that of memory cell arrays which are concurrently activated in a refresh for memory cell arrays. This configuration needs no drastic addition of circuits and allows a reduction in disturb test time for a plurality of memory cell arrays.

6 Claims, 5 Drawing Sheets

SEMICONDUCTOR MEMORY DEVICE

BACKGROUND OF THE INVENTION

1. Field of the Invention

The present invention relates to a semiconductor memory device and more particularly, to a semiconductor memory device, such as a dynamic random access memory (DRAM), which includes a test circuit for detecting leakage failure in memory cell transistors.

2. Description of the Background Art

As a test method (hereinafter, referred to as "a disturb refresh test") for detecting leakage failure in memory cell transistors in a conventional semiconductor memory device, or in particular, in DRAM, there is, for example, the following method.

First, high (or low) data is written into all memory cells (write operation). After writing the data into all the memory cells, any word lines are activated and charges in the memory cells are read out to bit lines intersecting the activated word lines. And by amplifying the read-out charges in a sense amplifier circuit (read/refresh operation), potentials in the bit lines and complementary bit lines are made high or low. This state is maintained for a guaranteed period of data retention time (hereinafter, referred to as "refresh test time) for memory cells.

In this state, in memory cell capacitors connected to unselected word lines, high data is held, and in memory cells connected to bit lines whose levels are low, potential differences arise between sources and drains of memory cell transistors, and subthreshold currents flow. Here, in a case of memory cells whose transistor threshold voltages are low, since large subthreshold currents flow, data cannot be held within refresh test time and the memory cells become defective. Therefore, after the end of the refresh test time, a readout operation is carried out for memory cells which are targeted for test and it is confirmed whether data can be correctly read out.

However, the potentials in the bit lines and the complementary bit lines in memory cells connected to the unselected word lines can be made high or low only on a memory cell array to memory cell array basis, with the memory cell array including a memory cell group and a sense amplifier circuit. The above-mentioned refresh test time is often set in several ms to several tens ms and is sufficiently long as compared with time required for reading out and writing data in the memory cells. Therefore, the disturb refresh test time occupies a large proportion of memory test time. As a process which allows further miniaturization and speeding-up is increasingly being developed, a memory cell array has been downscaled, resulting in an increase in the number of memory cell arrays.

In order to solve these problems, a method in which a plurality of word lines are concurrently activated in accordance with a test mode and a method in which a reduction in the above-mentioned disturb refresh test time is devised by concurrently selecting a plurality of memory cell arrays have been employed. For example, refer to Japanese Patent No. 3238806 (pages 3 to 5, FIG. 1).

However, in the above-mentioned conventional methods, in order to realize the concurrent activation of the plurality of word lines and the concurrent selection of the plurality of memory cell arrays, interposing a test mode signal in a logic gate of an address decoding circuit is required. Therefore, the conventional methods not only increase an area of a control circuitry section but also delay a row decoding signal, leading to a problem of impeding a high-speed operation of a memory.

SUMMARY OF THE INVENTION

Therefore, an object of the present invention is to provide a semiconductor memory device which realizes a reduction in disturb refresh test time without increasing an area of a control circuitry section and causing a delay of a row decoding signal.

The present invention is directed to a semiconductor memory device comprising a plurality of memory cell arrays, each of which includes a memory cell group and a sense amplifier circuit. In order to attain the above-mentioned object, the semiconductor device comprises: selecting means for concurrently selecting two or more memory cell arrays from among the plurality of memory cell arrays in response to a command, which is externally inputted, for selecting an automatic data refresh operation for the memory cell group; refreshing means for, in each of the selected two or more memory cell arrays, refreshing data in the memory cell group connected to word lines corresponding to address signals which are internally generated in an automatic manner; and switching means for, during the automatic data refresh operation, switching address signals for selecting word lines from address signals internally generated in an automatic manner to address signals externally inputted. Preferably, the switching is performed when a test mode signal is externally inputted during the data refresh operation.

In order to attain the above-mentioned object, a semiconductor memory device of the present invention comprises: selecting means for concurrently selecting two or more memory cell arrays from among the plurality of memory cell arrays in response to a command, which is externally inputted, for selecting an automatic data refresh operation for the memory cell group; refreshing means for, in each of the selected two or more memory cell arrays, refreshing data in the memory cell group connected to word lines corresponding to address signals internally generated in an automatic manner; and disconnecting means for, during a read operation, concurrently selecting memory cell arrays, a number of which is equal to a number of memory cell arrays which are activated in the automatic data refresh operation and for disconnecting the sense amplifier circuit and data lines. Preferably, the selecting and disconnecting made by the disconnecting means are performed when a test mode signal is externally inputted during the read operation.

In order to attain the above-mentioned object, a semiconductor memory device of the present invention comprises: first selecting means for concurrently selecting two or more memory cell arrays from among the plurality of memory cell arrays in response to a command, which is externally inputted, for selecting an automatic data refresh operation for the memory cell group; first refreshing means for, in each of the selected two or more memory cell arrays, refreshing data in the memory cell group connected to word lines corresponding to address signals internally generated in an automatic manner; second refreshing means for selecting the memory cell arrays connected to word lines corresponding to address signals externally inputted and for refreshing the selected memory cell arrays; and second selecting means for, during the refresh operation by the externally inputted address signals, selecting memory cell arrays, a number of which is equal to a number of the memory cells which are activated in the automatic data refresh operation. Preferably, the selecting made by the second selecting means is performed when a test mode signal is externally inputted during the refresh operation by the externally inputted address signals.

The above-described invention enables a reduction in the disturb refresh test only by switching the address signals for selecting word lines from the address signals internally generated in an automatic manner to the address signals externally inputted. And in a test mode, through utilizing a plurality of memory cell array activation control signals generated during the automatic data refresh operation for the memory cell group, memory cell arrays, the number of which is equal to the number of the plurality of memory cell array activation control signals, are selected and activated. This allows the disturb test time to be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to figures.

Figure 1:
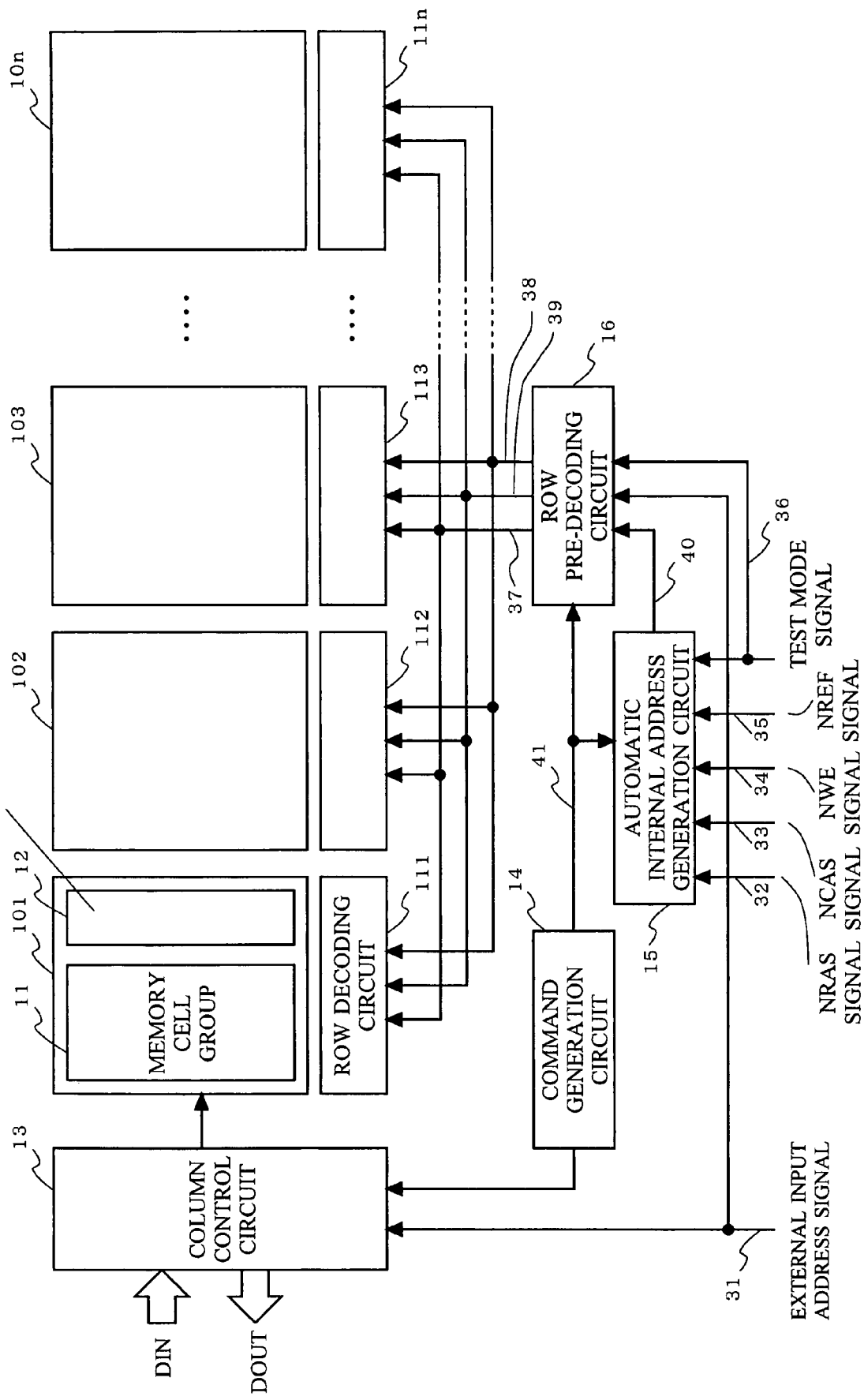
FIG. 1 is a schematic block diagram illustrating a configuration of a semiconductor memory device of the present invention.

FIG. 1 is a schematic block diagram illustrating a configuration of a semiconductor memory device of the present invention. In FIG. 1, the semiconductor memory device of the present invention comprises n (n is an integer equal to or greater than 2) memory cell arrays 101 to 10n, n row decoding circuits 111 to 11n, a column control circuit 13, a command generation circuit 14, an automatic internal address generation circuit 15, and a row pre-decoding circuit 16. Each of the memory cell arrays 101 to 10n includes a memory cell group 11 and a sense amplifier circuit 12.

The command generation circuit 14 generates an automatic memory cell refresh operation command signal 41 which determines an internal operation based on an NRAS signal 32, an NCAS signal 33, an NWE signal 34, an NREF signal 35, and a test mode signal 36 which are externally inputted. The automatic internal address generation circuit 15 receives the automatic memory cell refresh operation command signal 41 and automatically generates address signals. The row pre-decoding circuit 16 decodes an externally inputted address signal 31 and generates a word line pre-decoding signal 37, a memory cell array selection signal 38, and a data line selection signal 39. The memory cell group 11 has a plurality of memory cells in which data can be accumulated. The sense amplifier circuit 12 amplifies data read out from the memory cells. The column control circuit 13 controls the memory cell arrays 101 to 10n with respect to a column direction in response to the externally inputted address signal 31 and commands generated by the command generation circuit 14. The row decoding circuits 111 to 11n are provided so as to respectively correspond to the memory cell arrays 101 to 10n and control the memory cell arrays 101 to 10n with respect to a row direction in accordance with various signals provided by the row pre-decoding circuit 16.

The semiconductor memory device of the present invention, similarly to a conventional semiconductor memory device, has general functions supporting the following four operations: a read operation for reading out data in the memory cells in accordance with the NRAS signal 32, the NCAS signal 33, the NWE signal 34, and the NREF signal 35; a write operation for writing data into the memory cells; an automatic memory cell refresh operation for automatically refreshing data in the memory cells in accordance with an internally generated address signal 40; and a refresh operation (hereinafter, referred to as an RAS refresh operation) for allowing refreshing in any memory cells in response to the externally inputted address signal 31.

The semiconductor memory device of the present invention, having the above-mentioned general functions, is characterized by a function of the row pre-decoding circuit 16. Hereinafter, with reference to FIGS. 2 to 5, the characteristic function of the row pre-decoding circuit 16 will be described. FIG. 5 is a diagram illustrating an exemplary configuration of a conventional row pre-decoding circuit 56.

First Embodiment

Figure 2:
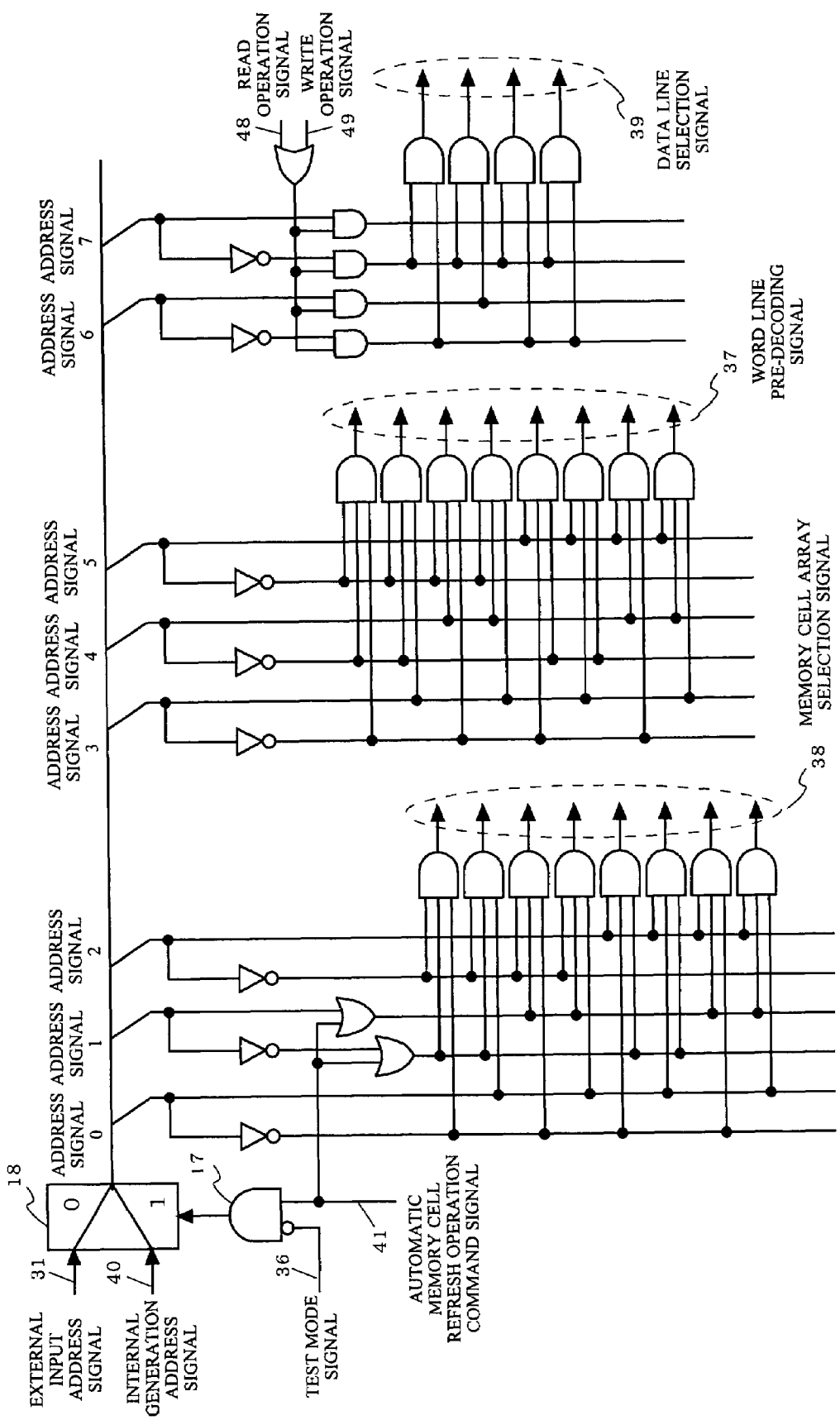
FIG. 2 is a diagram illustrating an exemplary configuration of a row pre-decoding circuit 16 according to a first embodiment of the present invention.

FIG. 2 is a diagram illustrating an exemplary configuration of a row pre-decoding circuit 16 according to a first embodiment of the present invention. The row pre-decoding circuit 16 according to the first embodiment is different from the conventional row pre-decoding circuit 56 in that the row pre-decoding circuit 16 includes a logic element 17 in which a test mode signal 36 is inputted and a logical product of an inversion signal of the test mode signal 36 and the automatic memory cell refresh operation command signal 41 is found.

When the row pre-decoding circuit 16 according to the first embodiment operates in a normal mode, the test mode signal 36 is set at a low level. In the state of this normal mode, when the automatic memory cell refresh operation command signal 41 reaches a high level, the internally generated address signal 40 is selected in a selector 18. And when the automatic memory cell refresh operation command signal 41 reaches a high level, an address signal 1 and a complementary signal of the address signal 1 both reach high levels. Therefore, the number of lines to which the memory cell array selection signal 38 flows is doubled as compared with that in the read operation and that in the write operation and as a result, the number of memory cell arrays which are activated is doubled.

As described above, by carrying out the automatic memory cell refresh operation in a state where the number of memory cell arrays which are activated is doubled, it is made possible to reduce the number of refresh cycles within a guaranteed period of data retention time. Note that when the test mode signal 36 is set at a low level, an operation is similar to a conventional one.

Next, a case in a test mode in which the test mode signal 36 is set at a high level will be described. A read operation and a write operation in this test mode state are same as those in a case where the test mode signal 36 is at a low level. When the automatic memory cell refresh operation command signal 41 reaches a high level, the number of activated memory cell arrays is doubled and the doubled number is equal to that in a case where the test mode signal 36 is at a low level. On the other hand, when the automatic memory cell refresh operation command signal 41 reaches a high level, the externally inputted address signal 31 is selected in the selector 18. Therefore, with the number of the activated memory cell arrays in the automatic memory cell refresh operation, it is made possible to select any word lines by using the externally inputted address signal 31.

Thus, in the automatic memory cell refresh operation, a disturb operation for memory cells is carried out in a state where memory cell arrays, the number of which is doubled, are concurrently activated and thereafter, data readout is carried out by an normal read operation for the memory cells for which the disturb operation has been carried out, thereby enabling detection of defective cells. Note that in this series of operation sequence, it is not necessary to make a change from a test mode (test mode signal: a high level) to a normal mode (test mode signal: a low level).

For example, where refresh test time is 10 ms, write time for all memory cells is Wt, read time for all the memory cells is Rt, and the number of memory cell arrays is n, conventional test time T in a case where there is no test mode is expressed by the following equation (1).

$$T=Wt+10 \times n+Rt \qquad (1)$$

On the contrary, in the first embodiment in which there is a test mode, since the number of memory cell arrays which are concurrently activated is doubled, test time T1 is expressed by the following equation (2).

$$T1=Wt+10 \times n/2+Rt \qquad (2)$$

Therefore, in a case where read time Rt and write time Wt for all the memory cells are negligibly short, disturb refresh time in the present invention is approximately half of the conventional test time.

As described above, the semiconductor memory device, which uses the row pre-decoding circuit 16, according to the first embodiment of the present invention allows a reduction in the disturb refresh test time only by using a logic gate which switches an address signal for selecting word lines from the internally generated address signal 40 generated in the automatic internal address generation circuit 15 to the externally inputted address signal 31.

Even in a state of a test mode, a normal operation is possible. Therefore, after a test mode has set in, a potential is provided between a source and a drain of a memory cell transistor through inputting a refresh command, and a read operation for targeted memory cells is carried out after having held the refresh test time without exiting from the test mode, thereby enabling the disturb refresh test without switching the test mode.

Although in the first embodiment, the number of memory cell arrays which are activated in the automatic memory cell refresh operation is doubled, it is obvious that an effect of enabling a reduction in test time is great in a case of memory specifications in which the number of activated blocks in the automatic memory cell refresh operation is large.

Second Embodiment

Figure 3:
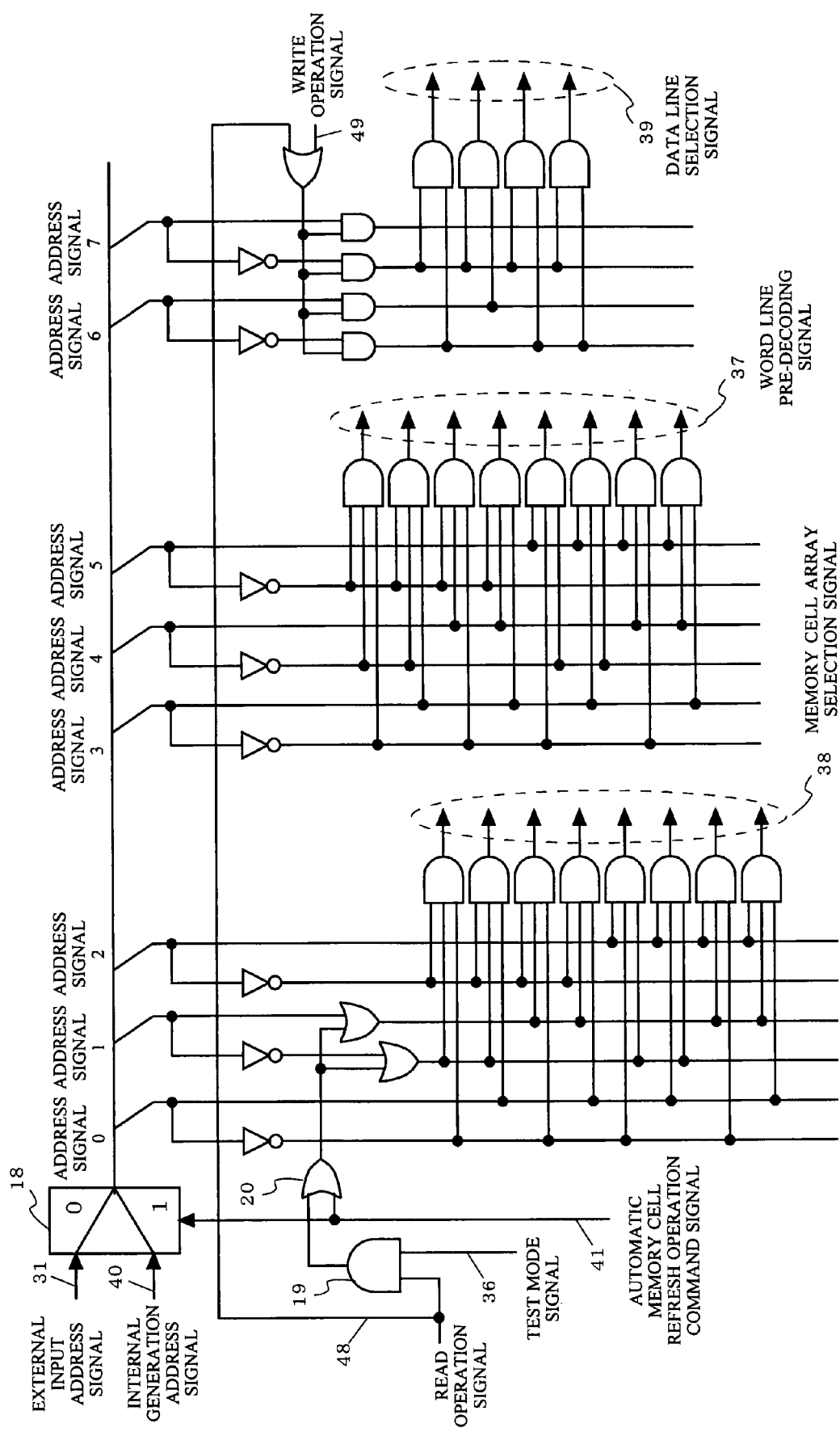
FIG. 3 is a diagram illustrating an exemplary configuration of a row pre-decoding circuit 16 according to a second embodiment of the present invention.

FIG. 3 is a diagram illustrating an exemplary configuration of a row pre-decoding circuit 16 according to a second embodiment of the present invention. The row pre-decoding circuit 16 according to the second embodiment is different from the conventional row pre-decoding circuit 56 in that the row pre-decoding circuit 16 includes: a logic element 19 in which a test mode signal 36 is inputted and a logical product of a test mode signal 36 and a read operation signal 48 is found; and a logic element 20 in which a logical sum of an output of the logic element 19 and an automatic memory cell refresh operation command signal 41 is found.

When the row pre-decoding circuit 16 according to the second embodiment operates in a normal mode, the test mode signal 36 is set at a low level. In a state of this normal mode, a read operation, a write operation, and an automatic memory cell refresh operation are same as those in the above-described first embodiment.

Next, a case of a test mode in which the test mode signal 36 is set at a high level will be described. The write operation and the automatic memory cell refresh operation in this test mode state are same as those in a case where the test mode signal 36 is at a low level. When the read operation is selected, the number of memory cell arrays which are activated is doubled and the doubled number of activated memory cell arrays is equal to that in the automatic memory cell refresh operation in a case where the test mode signal 36 is at a low level.

In a normal read operation, data in memory cells amplified in the sense amplifier circuit 12 is connected to data lines and outputted as an external output signal. However, when the test mode signal 36 is at a high level, a plurality of memory cell arrays are activated. Therefore, when in this state, the data amplified in the sense amplifier circuit 12 is connected to the data lines, data is connected from two memory cell arrays to one data line, causing a data conflict. This may not only cause a through-current to be generated but in a worst case, destroy data held in the memory cells.

Consequently, in order not to read out, to data lines, data amplified in the sense amplifier circuit 12 when the test mode signal 36 is at a high level, a configuration in which the data line selection signal 39 is in a deactivated state is employed. In this configuration, in the read operation, with the number of activated memory cell arrays in the automatic memory cell refresh operation, it is made possible to select any word lines by using the externally inputted address signal 31 and a command in a test mode state which the above-described first embodiment cannot carry out is also made possible. In addition, this configuration enables the below-described test sequence.

First, in a normal mode state (a test mode signal: a low level), data is written into all memory cells. And a change to a test mode state (a test mode signal: a high level) is made, a read operation is selected by inputting an external command, and a disturb operation for the memory cells is carried out in a state where the number of memory cell arrays which are currently activated is doubled. Thereafter, a data refresh operation for all the memory cells is carried out through an automatic memory cell refresh operation by using an external command. This means that data refresh is carried out also for memory cells which are not activated. This operation is carried out for all the memory cell arrays. A change is made from the test mode to the normal mode (a test mode signal: a low level) and through reading out data in all the memory cells, it is checked whether or not there is a defective cell.

Where data refresh time for all the memory cells is DRFt, test time T2 in a test sequence in the second embodiment is expressed by the following equation (3).

$$T2=Wt+10 \times n/2+DRFt \times n/2+Rt \qquad (3)$$

Therefore, although when compared with the test time T (see the above-mentioned equation (1)) in the conventional test sequence, the test time is short, when compared with the test time T1 (see the above-mentioned equation (2)), the test time is long by time DRFt×n/2.

However, in a case of the test sequence in the second embodiment, after the end of the data retention test time, the data refresh operation is carried out for not only activated memory cell arrays but also deactivated memory cell arrays. Normally, in the deactivated memory cell arrays which are in a standby state, there exist defective memory cells caused by junction leakage. Consequently, the test sequence in the second embodiment allows detection of defective memory cells caused by the junction leakage in addition to defective memory cells caused by transistor leakage.

As described above, the semiconductor memory device, which uses the row pre-decoding circuit 16, according to the second embodiment of the present invention has a configuration in which a plurality of memory cell arrays can be activated in the read operation by using the external command in the test mode state and data read out from the memory cells is not connected to the data lines. Thus, pieces of data read out from the plurality of memory cell arrays do not conflict with one another on the data lines.

In the second embodiment, the automatic memory cell refresh operation is possible even in the test mode state. Therefore, after the test mode state has set in, through providing a potential between a source and a drain of a memory cell transistor by inputting a read command, a disturb operation for the memory cells can be carried out. And after the end of the refresh test time, data in all the memory cells is refreshed by the automatic memory cell refresh operation command signal 41. After this has been carried out for all the memory cell arrays, by exiting from the test mode state, whether data in all the memory cells is not destroyed is confirmed by a normal read operation.

Further, when compared with the first embodiment, the second embodiment has botheration: that after the disturb operation for the memory cells, the automatic memory cell refresh operation is carried out for all the memory cells, thereby prolonging the test time and making it necessary to change the test mode upon checking data in the memory cells. However, the second embodiment has an advantage that since the refresh test time for unselected memory cell arrays, let alone the selected memory cell arrays for which the disturb refresh test is carried out as in the first embodiment, is retained in a standby state, a junction leakage test for memory cells is concurrently enabled.

Third Embodiment

Figure 4:
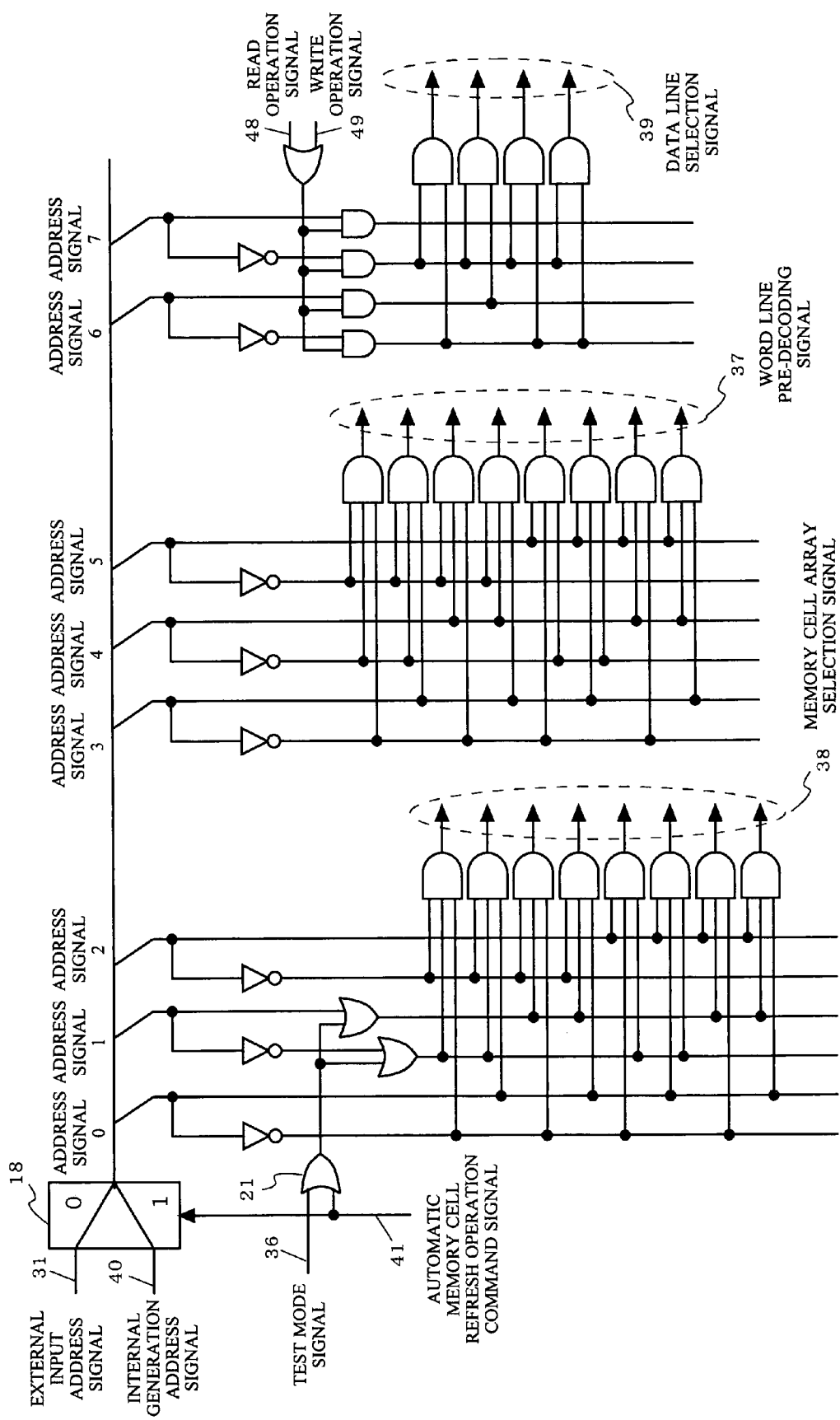
FIG. 4 is a diagram illustrating an exemplary configuration of a row pre-decoding circuit 16 according to a third embodiment of the present invention.
Figure 5:
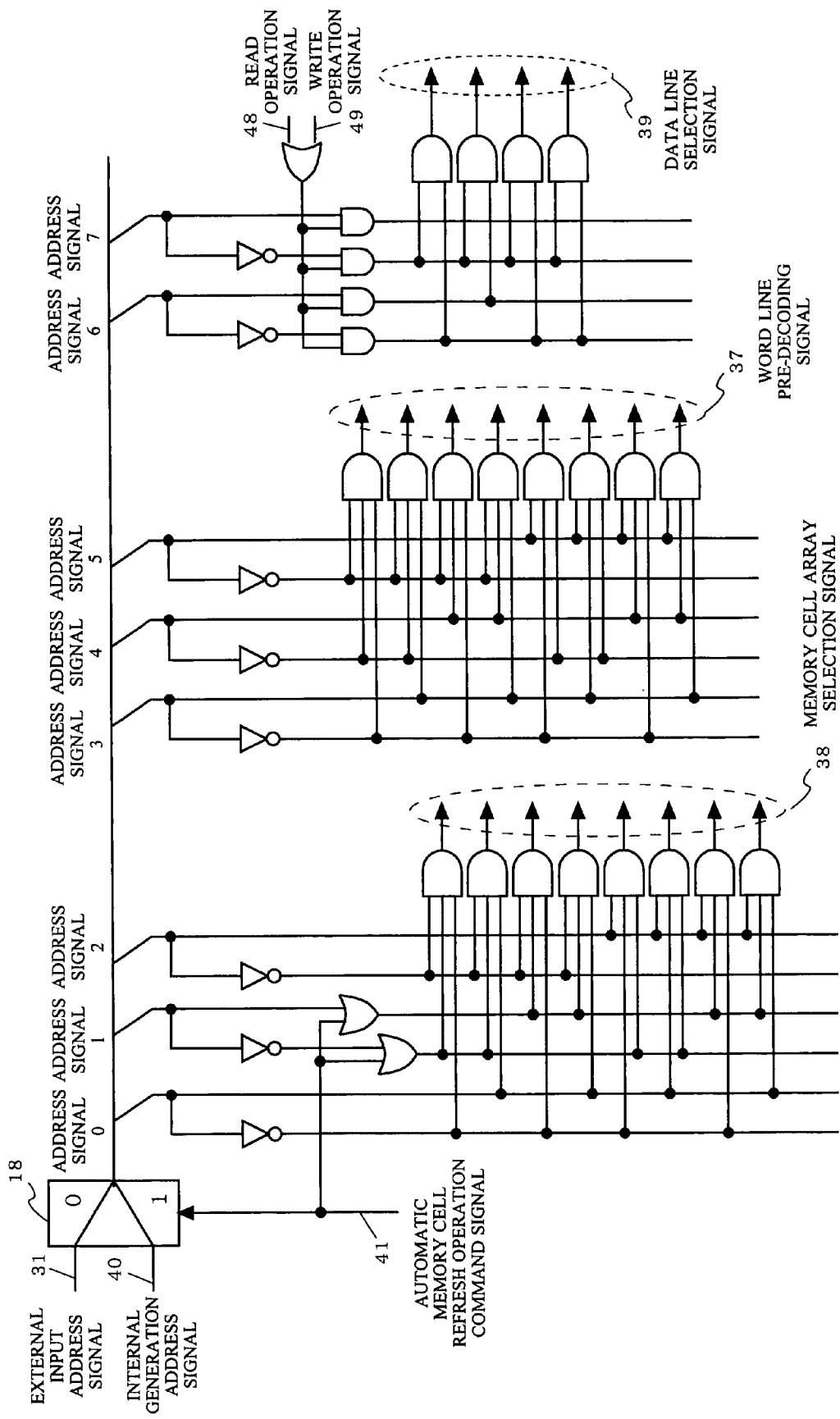
FIG. 5 is a diagram illustrating an exemplary configuration of a conventional row pre-decoding circuit 56.

FIG. 4 is a diagram illustrating an exemplary configuration of a row pre-decoding circuit 16 according to a third embodiment according to the present invention. The row pre-decoding circuit 16 according to the third embodiment is different from the conventional row pre-decoding circuit 56 in that the row pre-decoding circuit 16 includes a logic element 21 in which a test mode signal 36 is inputted and a logical sum of the test mode signal 36 and an automatic memory cell refresh operation command signal 41 is found.

The row pre-decoding circuit 16 in the third embodiment supports an RAS refresh operation for any memory cells by using an externally inputted address signal 31 as an externally inputted command. When the row pre-decoding circuit 16 in the third embodiment is set to be in a test mode state, the row pre-decoding circuit 16 is characterized in that memory cell arrays, the number of which is equal to that of the memory cell arrays which are activated in an automatic memory cell refresh operation, are activated.

In a normal operation mode, the test mode signal 36 is set to be at a low level. In this normal mode state, the number of memory cell arrays which are concurrently activated in the automatic memory cell refresh operation is doubled, whereas only one memory cell array is activated in each of a read operation, a write operation and the RAS refresh operation.

Here the RAS refresh operation will be described. Normally, in the RAS refresh operation, a row operation is substantially same as that in the read operation and no column operation is carried out, which is a main difference. In other words, in the RAS refresh operation, only one memory cell array is normally activated.

Next, a case where the test mode signal 36 is set to be at a high level will be described. The automatic memory cell refresh operation in this test mode state is same as that in a case where the test mode signal 36 is at a low level. When the read operation is selected, the number of memory cell arrays which are activated is doubled and the doubled number of activated memory cell arrays is equal to that in the automatic memory cell refresh operation in a case where the test mode signal 36 is at a low level. By carrying out the RAS refresh operation in this test mode state, the number of memory cell arrays which are activated is made equal to that in the automatic memory cell refresh operation. This allows a plurality of memory cell arrays to be concurrently activated and any word lines to be selected in response to the externally inputted address signal 31, thereby enabling a reduction in the disturb test time, similarly to the first and second embodiments.

When in the third embodiment, since when the test mode state is set, a plurality of memory cell arrays are activated in both of the read operation and the write operation, a data conflict in the read operation and erroneous writing in the write operation may occur. For this reason, it is required to carry out a test while changing a test mode depending on the disturb operation, the normal read operation, and the write operation for the memory cells.

As described above, the semiconductor memory device, which uses the row pre-decoding circuit 16, according to the third embodiment of the present invention allows, by utilizing a plurality of activation control signals for the memory cell arrays, selection and activation of memory cell arrays, the number of which is equal to that of the memory cells which are activated in the automatic memory cell refresh operation. Thus, a reduction in the disturb test time is enabled.

While the invention has been described in detail, the foregoing description is in all aspects illustrative and not restrictive. It is understood that numerous other modifications and variations can be devised without departing from the scope of the invention.

What is claimed is:

1. A semiconductor memory device comprising a plurality of memory cell arrays, each of which includes a memory cell group and a sense amplifier circuit, the device comprising:

selecting means for concurrently selecting two or more memory cell arrays from among the plurality of memory cell arrays in response to a command, which is externally inputted, for selecting an automatic data refresh operation for the memory cell group;

refreshing means for, in each of the selected two or more memory cell arrays, refreshing data in the memory cell group connected to word lines corresponding to address signals which are internally generated in an automatic manner; and switching means for, during the automatic data refresh operation, switching address signals for selecting word lines from address signals internally generated in an automatic manner to address signals externally inputted.

2. The semiconductor memory device according to claim 1, wherein when a test mode signal is externally inputted during the automatic data refresh operation, the switching means switches address signals for selecting word lines from address signals internally generated in an automatic manner to address signals externally inputted.

3. A semiconductor memory device comprising a plurality of memory cell arrays, each of which includes a memory cell group and a sense amplifier circuit, the device comprising:
- selecting means for concurrently selecting two or more memory cell arrays from among the plurality of memory cell arrays in response to a command, which is externally inputted, for selecting an automatic data refresh operation for the memory cell group;
- refreshing means for, in each of the selected two or more memory cell arrays, refreshing data in the memory cell group connected to word lines corresponding to address signals which are internally generated in an automatic manner; and
- disconnecting means for, during a read operation, concurrently selecting memory cell arrays, a number of which is equal to a number of memory cell arrays which are activated in the automatic data refresh operation and for disconnecting the sense amplifier circuit and data lines.

4. The semiconductor memory device according to claim 3, wherein when a test mode signal is externally inputted during the read operation, the disconnecting means concurrently selects memory cell arrays, a number of which is equal to a number of memory cell arrays which are activated in the automatic data refresh operation and disconnects the sense amplifier circuit and data lines.

5. A semiconductor memory device comprising a plurality of memory cell arrays, each of which includes a memory cell group and a sense amplifier circuit, the device comprising:
- first selecting means for concurrently selecting two or more memory cell arrays from among the plurality of memory cell arrays in response to a command, which is externally inputted, for selecting an automatic data refresh operation for the memory cell group;
- first refreshing means for, in each of the selected two or more memory cell arrays, refreshing data in the memory cell group connected to word lines corresponding to address signals which are internally generated in an automatic manner;
- second refreshing means for selecting the memory cell arrays connected to word lines corresponding to address signals externally inputted and for refreshing the selected memory cell arrays; and
- second selecting means for, during the refresh operation by the externally inputted address signals, selecting memory cell arrays, a number of which is equal to a number of the memory cell arrays which are activated in the automatic data refresh operation.

6. The semiconductor memory device according to claim 5, wherein when a test mode signal is externally inputted during the refresh operation by the externally inputted address signals, the second selecting means selects memory cell arrays, a number of which is equal to a number of the memory cell arrays which are activated in the automatic data refresh operation.

* * * * *